(12) United States Patent
Gujer et al.

(10) Patent No.: US 6,572,708 B2
(45) Date of Patent: Jun. 3, 2003

(54) SEMICONDUCTOR WAFER SUPPORT LIFT-PIN ASSEMBLY

(75) Inventors: Rudolf Gujer, Saratoga, CA (US);
Thomas K. Cho, Palo Alto, CA (US);
Lily L. Pang, Fremont, CA (US);
Michael P. Karazim, San Jose, CA (US); Tetsuya Ishikawa, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 147 days.

(21) Appl. No.: 09/797,214

(22) Filed: Feb. 28, 2001

(65) Prior Publication Data

US 2002/0011204 A1 Jan. 31, 2002

Related U.S. Application Data

(60) Provisional application No. 60/185,283, filed on Feb. 28, 2000.

(51) Int. Cl.⁷ .......................... H01L 21/68; C23L 16/00
(52) U.S. Cl. ............. 118/728; 156/345.51; 156/345.54; 118/500
(58) Field of Search ................ 118/715–729, 500; 156/345.12

(56) References Cited

U.S. PATENT DOCUMENTS

| 4,431,473 A | 2/1984 | Okano et al. ............... 156/345 |
| 5,215,619 A | 6/1993 | Cheng et al. ............... 156/345 |
| 5,350,479 A | 9/1994 | Collins et al. ............... 156/345 |
| 5,669,977 A * | 9/1997 | Shufflebotham et al. .... 118/500 |
| 5,796,066 A * | 8/1998 | Guyot ........................ 118/728 |
| 5,956,837 A * | 9/1999 | Shiota et al. .................. 269/8 |

FOREIGN PATENT DOCUMENTS

JP     05129421 A  *  5/1993  ........... H01L/21/68

OTHER PUBLICATIONS

Pang et al. "Apparatus for Cleaning a Semiconductor Process Chamber" U.S. patent application Ser. No. 09/721,060, filed Nov. 21, 2000.

* cited by examiner

Primary Examiner—Gregory Mills
Assistant Examiner—Ram N Kackar
(74) Attorney, Agent, or Firm—Moser, Patterson & Sheridan

(57) ABSTRACT

A modular lift-pin assembly comprises a lift-pin having a distal end and a connector having a lift-pin end and an actuator end. The lift-pin end of the connector is coupled to the distal end of the lift-pin and an actuator pin is then coupled to the actuator end of the connector to actuate the lift-pin through the connector.

27 Claims, 8 Drawing Sheets

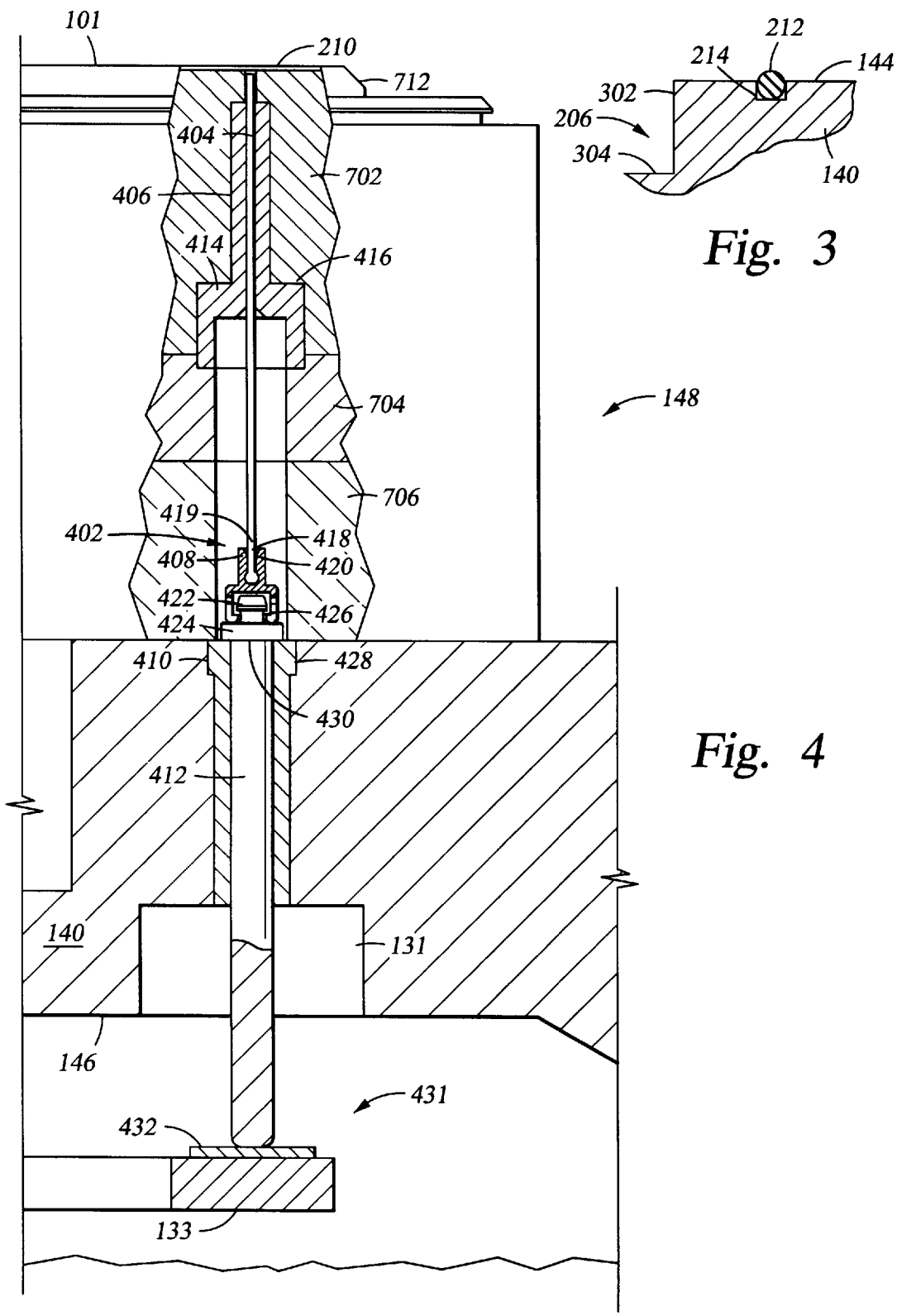

SEMICONDUCTOR WAFER SUPPORT LIFT-PIN ASSEMBLY

CROSS REFERENCE

This application claims benefit of U.S. Provisional Application No. 60/185,283, filed Feb. 28, 2000, which is hereby incorporated by reference in its entirety.

BACKGROUND OF THE DISCLOSURE

1. Field of Invention

The present invention relates generally to an apparatus for processing semiconductor wafers. More specifically, the invention relates to a lift-pin assembly for moving semiconductor wafer using in a semiconductor wafer-processing chamber.

2. Description of the Background Art

Integrated circuits have evolved into complex devices that include millions of transistors, capacitors and resistors on a single chip. The evolution of chip design results in faster circuitry and greater circuit density. As the demand for integrated circuits continues to rise, chip manufactures have demanded semiconductor process tooling having increased wafer throughput and greater product yield. To meet this increase in throughput, tooling is being developed to process wider diameter wafers, for example, wafers having diameters of 300 millimeters (mm).

Processing chambers generally capable of processing 300 mm substrates transport and support the substrate by a lift-pin assembly. Such lift-pin assembly can be used for temporarily supporting the substrates during transfer, thermal, chemical, optical and other treatments of the substrate. In order to transfer a substrate such as a wafer into a substrate processing chamber, it is conventional to utilize a robot arm and lift-pin assembly such as the types disclosed in U.S. Pat. Nos. 4,431,473, and 5,215,619. Specifically, a wafer is supported by three pins dispersed approximately 120 degrees apart and projecting from a lifter ring. The lifter ring is attached to a robotic arm. The lift-pins are supported on the lifter ring forming part of a substrate support assembly wherein the lifter ring is movable in a vertical direction between upper and lower positions. The lifter ring is movable such that the lift-pins have an upper surface located above the substrate support surface of the substrate holder when the lifter is in the upper position. Furthermore, the upper surface of the lift-pin is below the substrate support surface when the lifter ring is in the lower position. Thus, part of each lift-pin passes through a respective lift-pin hole in the substrate support when the lifter ring moves from either the lower position to the upper position. To drive the lifter ring, an actuator, such as a conventional pneumatic cylinder is generally used. The cylinder drives the lifter ring in the up or down positions, which in turn drive the lift-pins that raise or lower the wafer.

One problem that has been observed is that the lift-pins may bind as they pass through the lift-pin holes in the substrate support. Another problem is that the increased size in the industry from 200 mm to 300 mm wafers requires redesign of the processing chambers and accordingly, the lift-pin assemblies with regard to their configuration with other components in the substrate support assembly.

Therefore, there is a need in the art for a lift-pin assembly that does not bind in the lift-pin holes of the substrate support as the pins are raised or lowered. Moreover, it would be desirable for such a processing system to minimize the number of components and provide ease of serviceability.

SUMMARY OF INVENTION

The disadvantages associated with the prior art are overcome by the present invention of a semiconductor processing system comprising a chamber body that has a sidewall and at least one support arm extending radially inwards therefrom. A support platform is coupled to the support arm and centrally disposed in the chamber body. Disposed above the support platform is a base having a centrally disposed recess, and a substrate support is disposed over said base.

The system additionally features a lift-arm assembly for actuating a plurality of modular lift-pin assemblies. Each modular lift-pin assembly comprises a lift-pin having a distal end and a connector having a lift-pin end and an actuator end. The lift-pin end of the connector is coupled to the distal end of the lift-pin and an actuator pin is then coupled to the actuator end of the connector to actuate the lift-pin through the connector.

A plurality of lift-pin holes extends through the support platform, the base, the substrate support, and circumscribe the centrally disposed recess. Each of the modular lift-pin assemblies respectively extends (i.e., slidably extends) through the plurality of lift-pin holes, and a C-shaped lift-arm assembly disposed below the base engages the plurality of lift-pin assemblies to raise and lower a semiconductor wafer. The lift-arm assembly passes into a slot in the support platform, thus reducing the space required below the support platform to operate the lift-pins. The reduced space requirement allows for the support platform to be positioned closer to a pumping stack and thereby increasing the conductance of gases through the chamber.

BRIEF DESCRIPTION OF DRAWINGS

The teachings of the present invention can be readily understood by considering the following detailed description in conjunction with the accompanying drawings, in which:

FIG. 3 depicts a partial cross-sectional view of a centrally disposed recess in the chamber body taken along section line 3—3 of FIG. 2;

FIG. 4 depicts a cross sectional view of a lift-pin assembly taken along section line 4—4 of FIG. 2;

To facilitate understanding, identical reference numerals have been used, where possible, to designate identical element that are common to the figures.

DETAIL DESCRIPTION OF INVENTION

The present invention generally provides an apparatus for processing a semiconductor substrate. The invention is illustratively described below as a chemical vapor deposition system, such as an ULTIMA® High Density Plasma Chemical Vapor Deposition (HDP-CVD) chamber system, available from Applied Materials, Inc. of Santa Clara, Calif. However, it should be understood that the invention may be incorporated into other chamber configurations such as physical vapor deposition chambers, etch chambers, ion implant chambers, and other semiconductor processing chambers.

Figure 1:
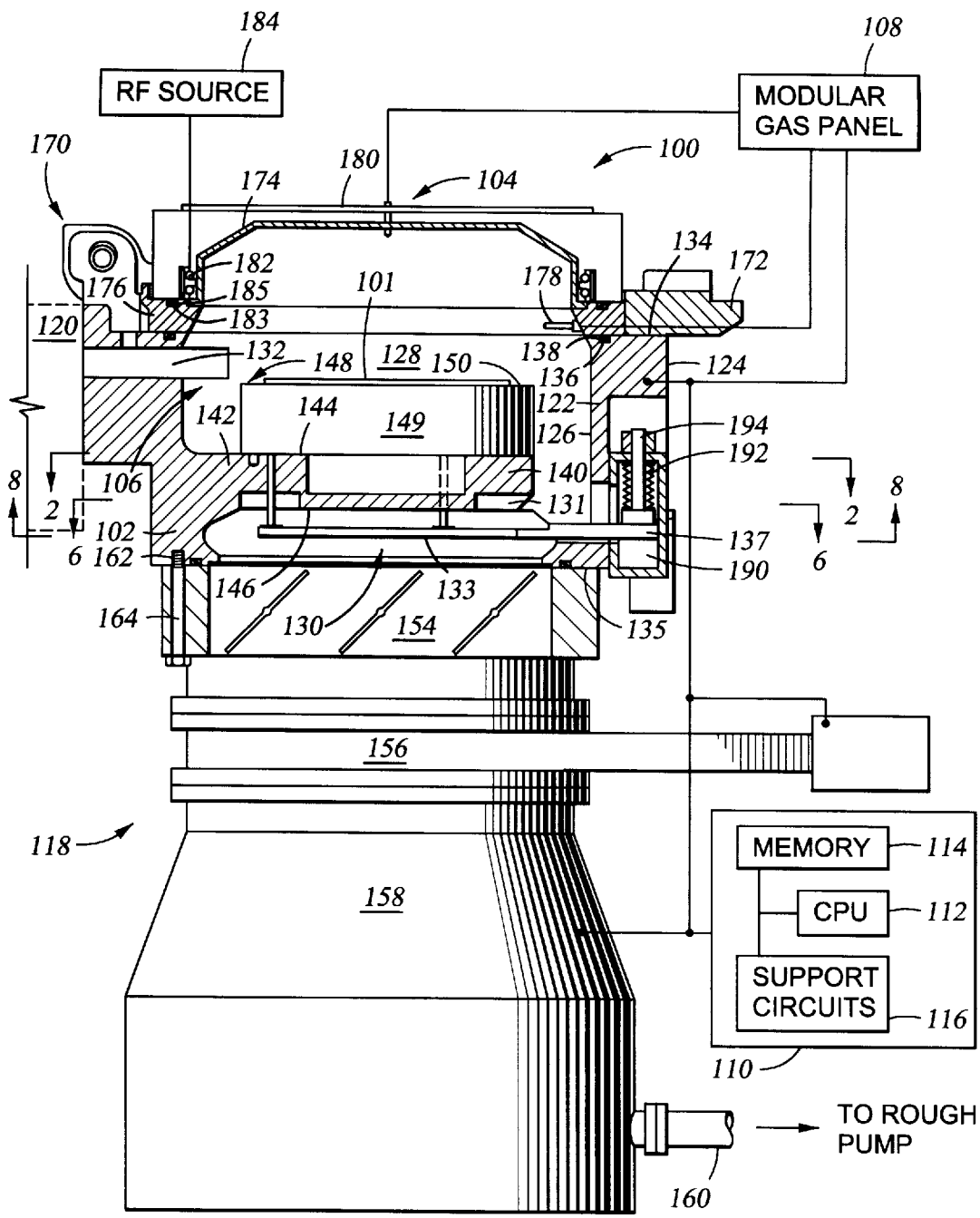
FIG. 1 depicts a cross sectional view of a semiconductor processing system of the present invention.

FIG. 1 depicts a cross sectional view of a semiconductor processing system of the present invention. Specifically, FIG. 1 depicts an illustrative HDP-CVD chamber system (system) 100 that generally comprises a chamber body 102 and a lid assembly 104 that defines an evacuable chamber 106 for carrying out substrate processing. The system 100 may be one of a number of substrate processing systems that are coupled to a processing platform 120 such as a CENTURA® processing platform, available from Applied Materials, Inc. The system 100 includes a pumping stack 118, a modular gas panel, 108 and a controller 110. The controller 110 has a central processing unit (CPU) 112, a memory 114, and support circuits 116. The controller 110 is coupled to the various components of the system 100 to facilitate control of the deposition process.

The chamber body 102 is typically a unitary, machined structure fabricated from a rigid block of material such as aluminum. The chamber body 102 has a plurality of sidewalls 122 having a substantially rectangular outside surface 124 and an annular, inner surface 126 that defines a processing region 128. The annular, inner surface 126 defining processing region 128 generally tapers to define an exhaust passage 130. Furthermore, at least one sidewall 122 is electrically grounded. The chamber body 102 contains a substrate entry port 132 that is selectively sealed by a slit valve (not shown) disposed in the processing platform 120.

A first surface 134 of the chamber body 102 defines a generally flat landing area on which the lid assembly 104 is supported. An o-ring groove 136 is formed in the first surface 134 of the sidewall 122 to receive an o-ring 138 that forms a gas-tight seal between the chamber body 102 and the lid assembly 104. Typically, the o-ring 138 is fabricated from a fluoropolymer or other material compatible with the processing environment such as CHEMREZ™. The lid assembly 104 generally includes a lid 172, an energy-transmitting dome 174 and a gas distribution ring 176. The lid 172 is coupled the dome 174 and gas distribution ring 176. The lid 172 is typically fabricated from aluminum.

The dome 174 is made of dielectric material that is transmissive to RF energy, for example, a ceramic such as aluminum oxide ($Al_2O_3$). At least one antenna or coil 182 is wound external to the dielectric dome 174. The coil 182 is powered by a variable frequency RF power source 184. The RF power source 184 includes a RF matching network to transfer power to plasma generated in the processing region 128. Disposed above the dome 174 is a temperature control assembly (not shown) that is utilized to regulate the temperature of the dome 174 during the various process cycles, i.e., deposition cycle and cleaning cycle. Typically, the dome 174 is heated during cleaning cycles and cooled during processing. A temperature control assembly in a semiconductor wafer processing system is disclosed in U.S. patent application, Ser. No. 09/721,060, entitled APPARATUS FOR CLEANING A SEMICONDUCTOR PROCESS CHAMBER, filed Nov. 21, 2000, and assigned to the same assignee as the present application, Applied Materials, Inc., of Santa Clara, Calif. This patent application is incorporated by reference as if fully reproduced herein.

The gas distribution ring 176 is disposed between the dome 174 and the chamber body 102. Oaring grooves 183 are formed in the top of the gas distribution ring 176 to receive an o-ring 185 to seal the dome 174 and the top of the gas distribution ring 176. The gas distribution ring 176 typically comprises an annular ring made of aluminum or other suitable material having a plurality of ports (not shown) formed therein for receiving nozzles 178 that are in communication the gas panel 108. The gas panel 108 may alternately be coupled to the chamber 106 via a shower head or second nozzle 180 disposed beneath the dome 174.

Opposite the first surface 134 of the chamber body 102 upon which the lid assembly 104 is disposed, is a second surface 135. Disposed centrally in the second surface 135 is the exhaust passage 130. The second surface 135 defines a generally flat landing area that abuts the pumping stack 118 and communicates with the exhaust passage 130. The pumping stack 118 includes a throttle valve assembly 154, a gate valve 156 and a turbomolecular pump 158. The pumping stack 118 is mounted to the exhaust passage 130 of the chamber body 102 to provide pressure control within the system 100. Typically, the throttle valve assembly 154 is coupled to the chamber body 102, with the gate valve 156 disposed between the turbomolecular pump 158 and the throttle valve assembly 154. The throttle valve assembly 154 is mounted to the chamber body 102 via four mounting bolts 164, one of which is shown threaded into a threading mounting hole 162 disposed in the second surface 135 of the chamber body 102.

A line 160 couples the turbomolecular pump 158 to a remote mainframe or roughing pump (not shown). The roughing pump evacuates the chamber 106 to a vacuum level within the operational range of the turbomolecular pump 158. Once the chamber 106 has been pumped down to the level wherein the turbomolecular pump 158 may operate, the turbomolecular pump 158 is activated to further reduce the chamber pressure to a processing vacuum level.

A substrate support platform 140 is coupled to the sidewall 122 by at least one support arm 142. Preferably the chamber comprises the first support arm 142, a second support arm 202, and a third support arm 204 (See FIG. 2 for second and third support arms 202 and 204). The support arms 142, 202 and 204 extend radially between the support platform 140 and the sidewall 122, positioning the support platform 140 in the center of the chamber 106. The support platform 140 comprises a first surface 144 for supporting a support assembly 148 and a second surface 146 that faces the exhaust passage 130. A substantially C-shaped slot 131 circumscribes the second surface 146 to provide room for a lift-pin arm 133 having a distal end, which is coupled to an actuator assembly 190, as discussed below.

The substrate support assembly 148 is disposed on the first surface 144 of the support platform 140. The substrate support assembly 148 generally comprises a substrate support 150 and a cathode base 149. The substrate support 150 may be a susceptor, a heater, ceramic body, or electrostatic chuck on which the substrate or wafer 101 is placed during processing. For a detailed understanding of an electrostatic chuck and its operation in processing the wafer, the reader should refer to the drawings and the detailed description in commonly assigned U.S. Pat. No. 5,350,479, issued Sep. 27, 1994, and incorporated herein by reference. That patent teaches an electrostatic chuck manufactured by Applied Materials, Inc. of Santa Clara, Calif.

Figure 2:
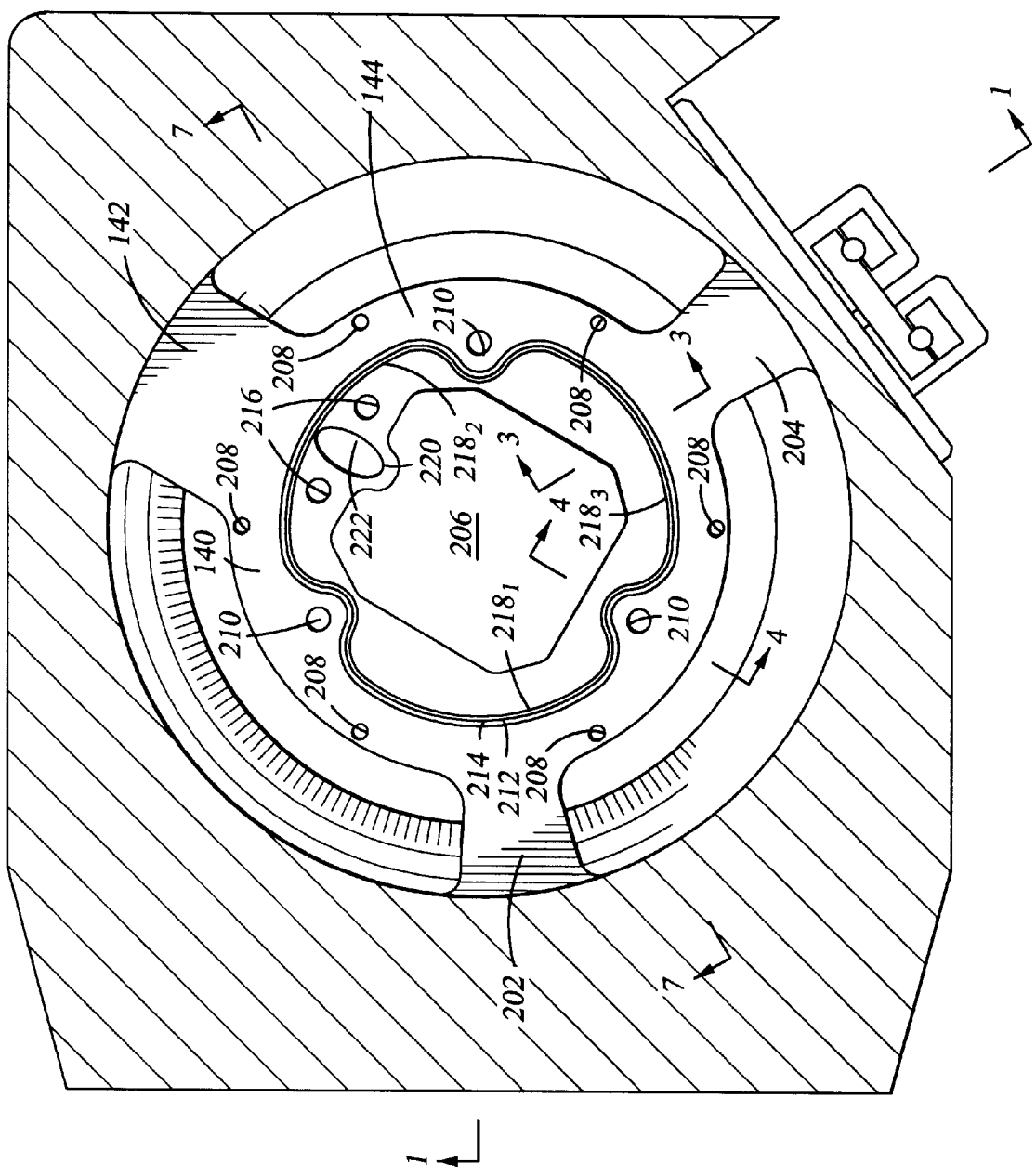
FIG. 2 depicts a cross sectional view of a chamber body, taken along section line 2—2 of FIG. 1.

FIG. 2 depicts a cross sectional view of a chamber body 102 taken along section line 2—2 of FIG. 1, and FIG. 3 depicts a partial cross-sectional view of a centrally disposed recess 206 in the chamber body 102 taken along section line 3—3 of FIG. 2. Referring to FIGS. 2 and 3 together, the first surface 144 of the support platform 140 has a centrally disposed recess 206. The centrally disposed recess 206 is defined by one or more walls 302 (e.g., a cylindrical wall or 4 walls) that extend from the first surface 144 to a bottom 304 of the recess 206. The first surface 144 additionally comprises a plurality of threaded mounting holes 208 and a plurality of lift-pin holes 210. In one embodiment, the support platform 140 contains six mounting holes 208 and three lift-pin holes 210. The mounting holes 208 are typically blind holes while the lift-pin holes 210 generally extend through the support platform 140 such that a lower end of the lift-pin hole 210 exits the second surface 146 and is exposed to the exhaust passage 130.

A lobed o-ring 212 is disposed in a conforming o-ring groove 214 formed in the first surface 144. The lobed o-ring 212 is fabricated from a fluoropolymer or other material compatible with the processing environment such as CHEMREZ™.

Generally, the lobed o-ring 214 provides a seal that separates the processing environment of the processing region 128 from the typically atmospheric environment of the recess 206. The lobed o-ring 212 generally passes radially inward of the lift-pin holes 210. The lobed o-ring 212 includes a plurality of lobes 218 (e.g., lobes $218_1$, $218_2$, and $218_3$) that are disposed radially outward such that a greater area of the first surface 144 is isolated from the processing region 128. For example, one or more gas passages 216 may be disposed through the support platform 140 in the area of the first surface 144 bordered by the one of the lobes 218. Additionally, the area of the first surface 144 bordered by one of the lobes 218 provides space for a first end 220 of an RF conduit 222 to be disposed on the first surface 144 without requiring o-rings to isolate the RF conduit from the processing region 128. As the lift-pin holes 210 are on the processing region side of the lobed o-ring 212, the lift-pin holes 210 do not require additional o-rings to prevent the processing environment from entering the recess 206. Thus, the lobed o-ring 212 reduces the number of o-rings required. Additionally, with fewer o-rings, the tolerance sensitivity among the o-rings is reduced, allowing for enhanced seal reliability and improved parallelism between sealing surfaces.

Figure 7:
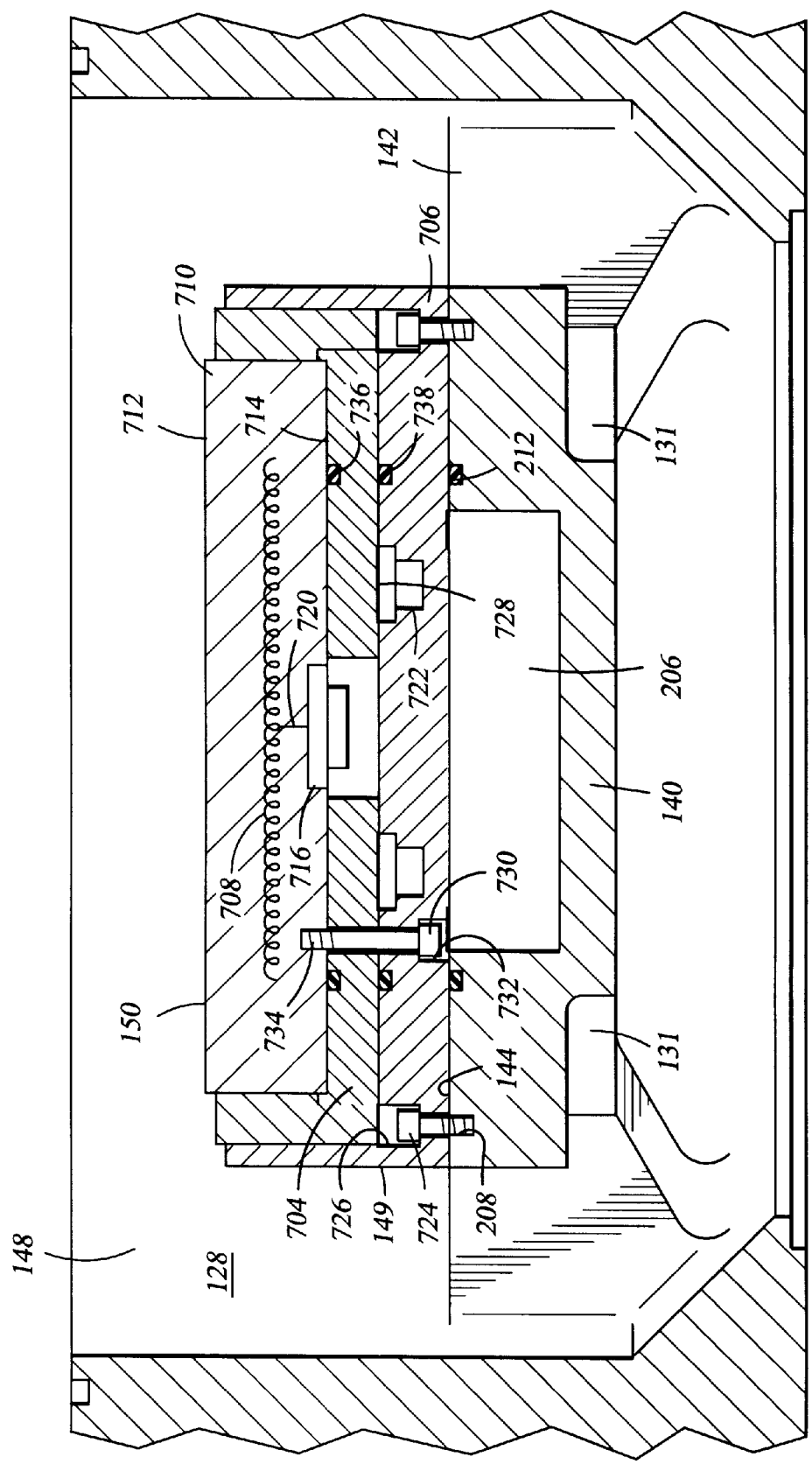
FIG. 7 depicts a cross sectional view of a substrate support assembly taken along section line 7—7 of FIG. 2.

FIG. 7 depicts a cross sectional view of a substrate support assembly 148 taken along section line 7—7 of FIG. 2. In particular, FIG. 7 depicts the substrate support assembly 148 disposed on the first surface 144 of the support platform 140. The substrate support assembly 148 generally comprises a substrate support (shown as an electrostatic chuck 150), a plate 704, and a cathode base 149. The substrate support 150 may be a susceptor, a heater, ceramic body or electrostatic chuck on which the substrate or wafer (not shown) is placed during processing.

The electrostatic chuck 150 generally comprises a ceramic body 710 having a support surface 712 and an opposing second surface 714. The electrostatic chuck 150 generally includes at least one electrode 708 embedded within the ceramic body 710. The electrode 708 is electrically coupled to a contact pad 716 disposed on the second surface 714 via a conductive feedthrough 720. The contact pad 716 is then coupled to a remote power source, such as a high voltage DC (HVDC) power supply (not shown) to chuck the wafer 101. In one embodiment, the chucking electrodes 708 also serve as biasing electrodes. In particular, a RF power supply (not shown) is superimposed on the electrodes 708 to create a biasing voltage. However, preferably the cathode base 149 is directly coupled to the biasing RF power supply (not shown) to bias the wafer 101.

The plate 704 is disposed between the electrostatic chuck 150 and the cathode base 149. The plate 704 is an insulative plate fabricated from a dielectric material such as ceramic, and generally includes a plurality of passages to permit assess to the electrostatic chuck and support surface. The individual passages, o-rings, and reference numerals have been omitted for the sake of clarity.

The cathode base 149 includes a substantially coil shaped cooling fluid channel 722 disposed there within and generally parallel to the first surface 144. The cooling fluid channel 722 typically is sealed using a cap 728 disposed over the fluid channel 722. The cooling fluid channel 722 is provided with a cooling fluid, such as water from a pair of conduits (i.e. supply and return conduits (not shown)) coupled to a fluid source (not shown) external to the processing system 100. The cathode base 149 is fastened to the support platform 140 utilizing a plurality of bolts 724 that pass through a corresponding counter-bore 726 in the cathode base 149 and into the threaded mounting hole 208 disposed in the support platform 140.

The support assembly 148 is secured together by threaded fasteners 730, one of which is shown. The threaded fastener 730 extends from a counter-bored hole 732 in the cathode base 149, passing through the insulative plate 704 and into a threaded hole 734 in the electrostatic chuck 150. A second lobed o-ring 736 and a third lobed o-ring 738, configured substantially identical to the lobed o-ring 212, are disposed respectively between the cathode base 149, insulative plate 704 and electrostatic chuck 150. Generally, each lobed o-ring 736, 738 reduces the number of o-rings required between the cathode base 149, insulative plate 704, and electrostatic chuck 150 as described above with reference to the lobed o-ring 212.

Figure 5A:
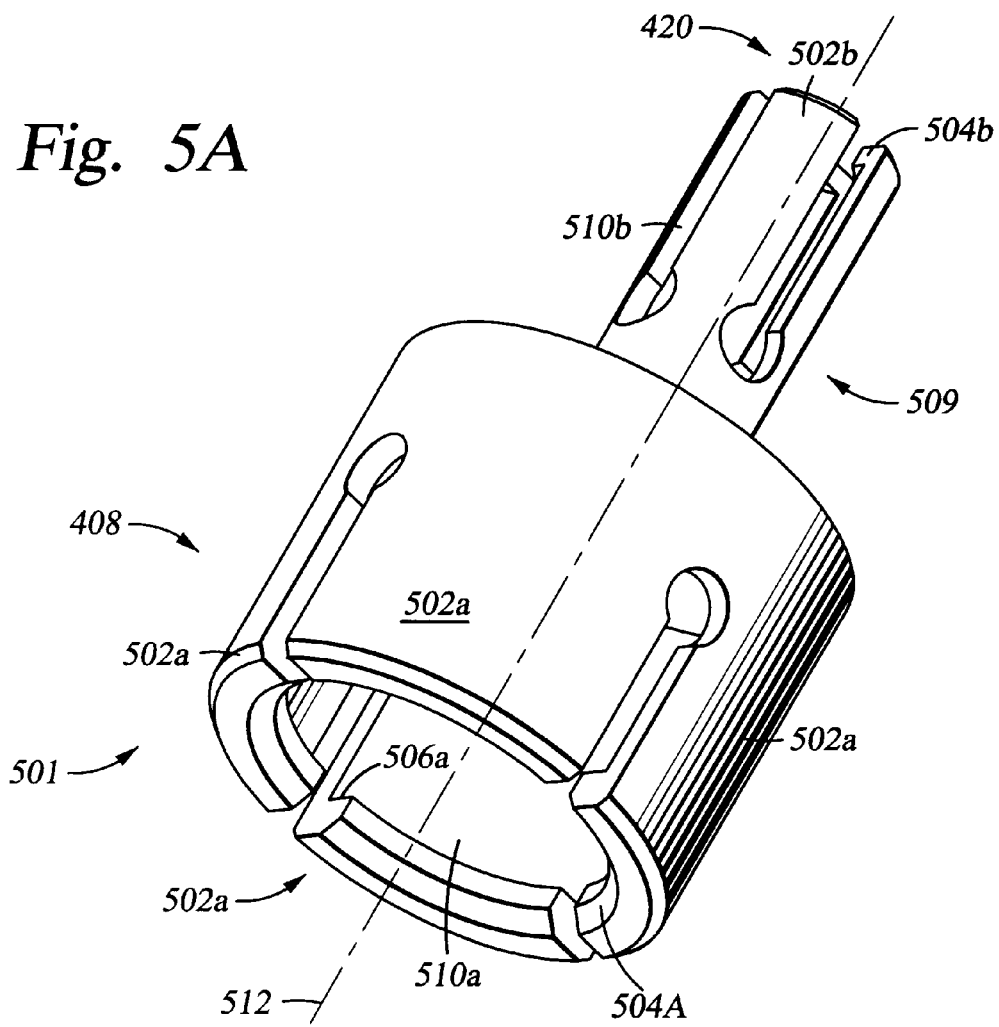
FIGS. 5A and 5B depict perspective views of a connector of the lift-pin assembly of FIG. 4.
Figure 5B:
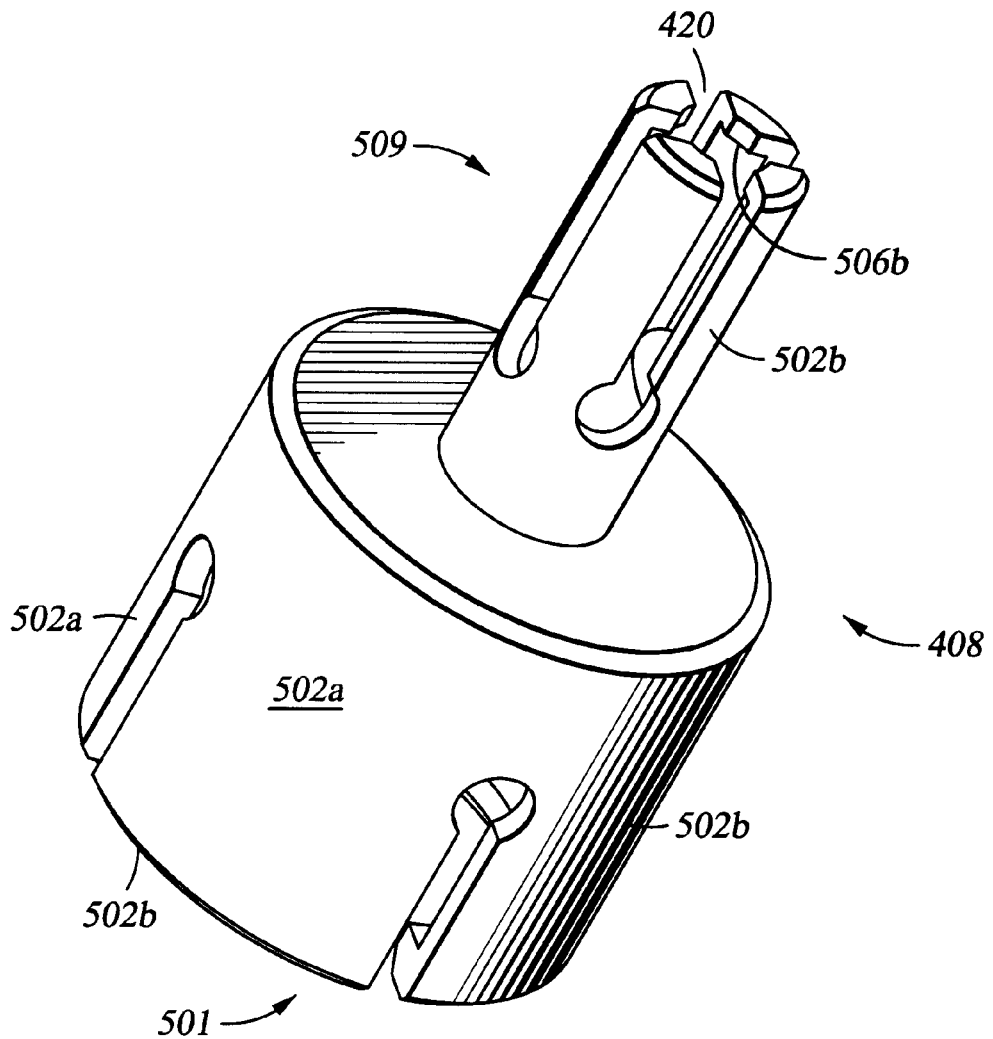

FIG. 4 depicts a cross sectional view of a lift-pin assembly 402 taken along section line 4—4 of FIG. 2. FIGS. 5A and 5B depict perspective views of a connector 408 of the lift-pin assembly 402 of FIG. 4. In particular, FIGS. 4, 5A, and 5B together depict the lift-pin assembly 402 having a lift-pin 404, which is disposed at least partially in the lift-pin hole 210. The lift-pin 404 is used to raise the substrate 101 from the electrostatic chuck 150 such that a blade of a robot (not shown) used to transfer the substrate 101 may access the underside of the substrate to facilitate transfer of the substrate. In one embodiment, the support assembly 148 comprises three lift-pin assemblies 402. Each lift-pin assembly 402 comprises a lift-pin 404, a first bushing 406, a connector 408, a second bushing 410, and an actuator pin 412. The first bushing 406 is disposed in the portion of the lift-pin hole 210 that passes through the electrostatic chuck 150. The first bushing 406 includes a larger diameter end 414 that is disposed in a corresponding larger diameter portion 416 of the lift-pin hole 210. The larger diameter end 414 retains the first bushing within the support assembly 148. The first bushing 406 guides the lift-pin 404 when the lift-pin 404 is actuated and retracted. Both the lift-pin 404 and the first bushing 406 are generally fabricated from ceramic.

FIGS. 5A and 5B are perspective views of the connector 408 of the lift-pin assembly 402 of FIG. 4. The connector 408 comprises a first end (i.e., actuator end) 501 and a second end (i.e., lift-pin end) 509, where the first end 501 has a diameter that is greater than a diameter of the second end 509. The connector 408 is typically a polymer suitable for use in a support assembly 148 such as VESPEL®. The first and second ends 501 and 509 of the connector 408 each comprise a plurality of catch fingers 502a and 502b (collectively, catch fingers 502). In one embodiment, four catch fingers 502 are illustratively disposed on each end 501 and 509 of the connector 408. Each finger 502a and 502b includes a lip 504a and 504b that extends radially inwards. Each lip 504a and 504b includes a flat 506a and 506b that is substantially perpendicular to a central axis 512 extending a length of the connector 408.

Referring to FIG. 4, the actuator pin 412 has a projecting portion 422 extending from a larger diameter portion 424 that is positioned at a proximate end 430 of the actuator pin 412. The projecting portion 422 has a diameter less than or equal to a diameter of the first end 501 of the connector 408 as defined by opposing inner surfaces 510a of the catch fingers 502a, but greater than a diameter defined by the lips 504a of the catch fingers 502a. The projecting portion 422 has an undercut 426 that permits the lips 504a to "snap" over the projecting portion 422. Each flat 506a of each lip 504a then banks against the undercut 426, thus securing the actuator pin 412 to the first end 501 of the connector 408.

Similarly, the lift-pin 404 includes a distal end 418 that is snap fitted into the second end 509 of the connector 408. More specifically, the distal end 418 is snap fitted into a bore 420 as defined by opposing inner surfaces 510b of the catch fingers 502b in the second end 501 of the connector 408. The distal end 418 of the lift-pin 404 has a diameter less than or equal to the bore 420 of the second end 509 of the connector 408. Furthermore, the distal end 418 diameter is greater than a diameter defined by the lips 504b of the catch fingers 502b. The distal end 418 of the lift-pin 404 has an undercut 419 that permits the lips 504b to "snap" over the distal end 418. Each flat 506b of each lip 504b then banks against the undercut 419, thus securing the distal end 418 of the lift-pin 404 to the second end 509 of the connector 408.

Referring to FIG. 4, the actuator pin 412 and second bushing 410 generally are fabricated from ceramic. The actuator pin 412 extends below the support platform 140 and is guided by the second bushing 410 when actuated or retracted. The larger diameter portion 424 of the actuator pin 412 is positioned to the lift-pin side of the second bushing 410. The larger diameter portion 424 is larger than the inside diameter of the second bushing 410, limiting the travel of the lift-pin 404 away from the support surface 712. The weight of the actuator pin 412 maintains the lift-pin 404 in the retracted position shown in FIG. 4. The snap fit of the connector 408 to the actuator pin 412 allows for some misalignment of the lift-pin 404 and the actuator pin 412 without having those components bind in their respective bushings 406, 410 during movement.

The second bushing 410 comprises a larger diameter end 428 that is disposed towards the connector 408 in a corresponding stepped hole 428 in the support platform 140. The stepped hole 428 retains the bushing 410 in the support platform 140.

A lift-arm assembly 431 actuates the lift-pin assembly 402. The lift-arm assembly 431 comprises a plurality of wear pads 432 disposed on the lift-pin ring 133. The actuator pins 412 are disposed on the wear pads 432 so that when the lift-pin ring 133 is actuated towards the substrate support, the lift-pin ring 133 causes the actuator pins 412 to move the lift-pins 404, and correspondingly lift the substrate 101 from the support surface 712. As the wear pads 432 are larger in diameter that the portion of the actuator pins 412 that extend below the support platform 140, actuator pins 412 may float laterally across the wear pads 432. In this manner, there is greater open tolerance of the components and less binding of the lift-pins 404.

The distance between the pumping stack 118 and the support platform 140 is minimized to advantageously increase the conductance of the gases through the processing chamber 100. In particular, the distance below the support platform 140 for operating the lift-arm assembly 431 is minimized by providing the C-shaped slot 131 in the second surface 146 of the support platform 140. The lift-pin ring 133, when in a raised or actuated position, travels into the slot 131 such that the throw of the lift-pins 404 is greater than the distance between the lift-pin ring 133 and the second surface 146.

Figure 6:
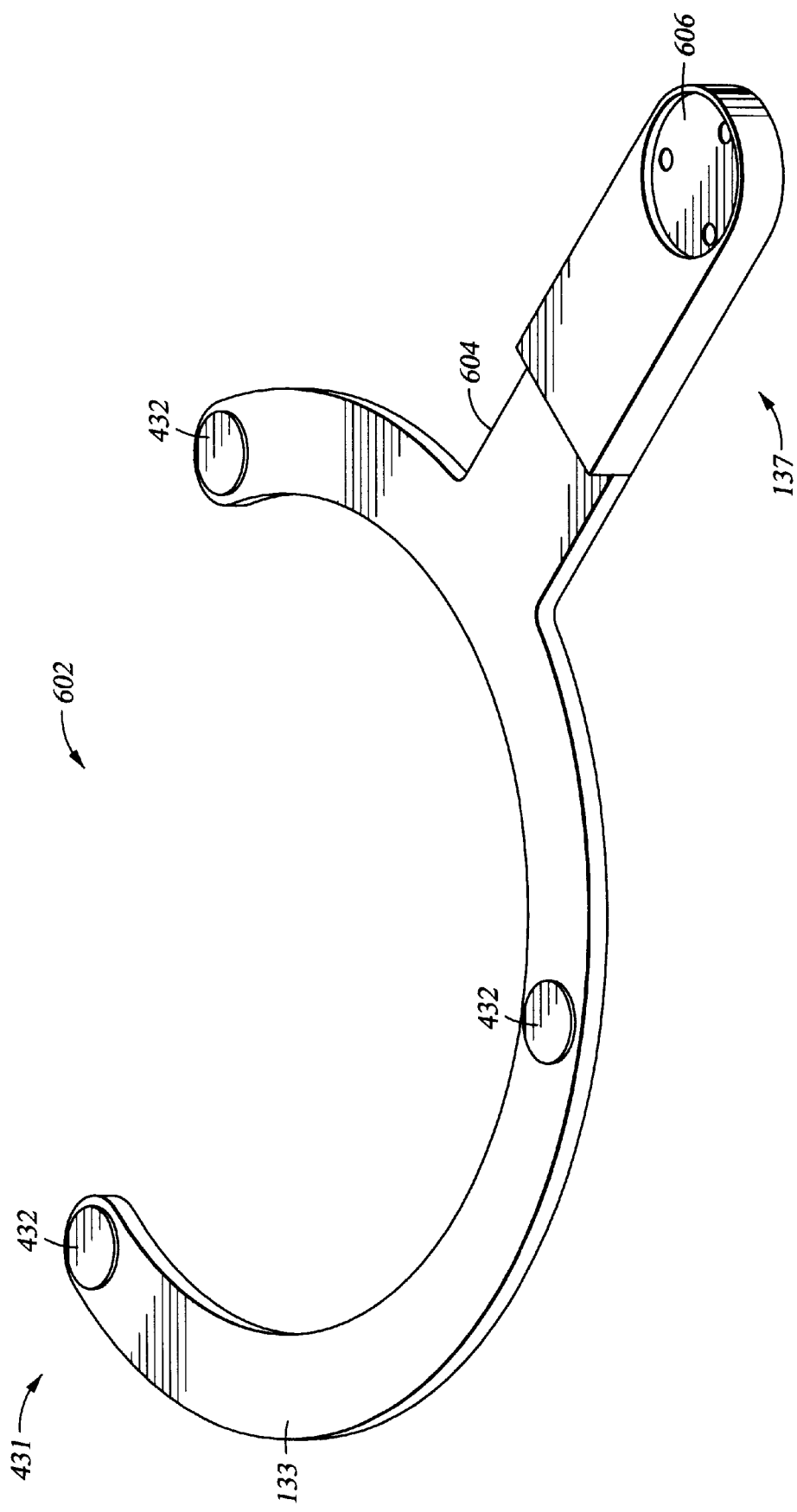
FIG. 6 depicts a perspective view of a lift-arm assembly of FIG. 1.

FIG. 6 depicts a perspective view of a lift-arm assembly 431 of FIG. 1. The lift-pin ring 133 includes an opening 602, such that the lift-pin ring 133 forms a substantially "C" shape. In one embodiment, the lift-arm assembly 431 comprises three wear pads 432. The lift-pin ring 133 is coupled to an actuation arm 604 that has a connecting portion 606 disposed at the distal end 137. The distal end 137 is disposed in the actuator assembly 190 as shown in FIG. 1.

Figure 8:
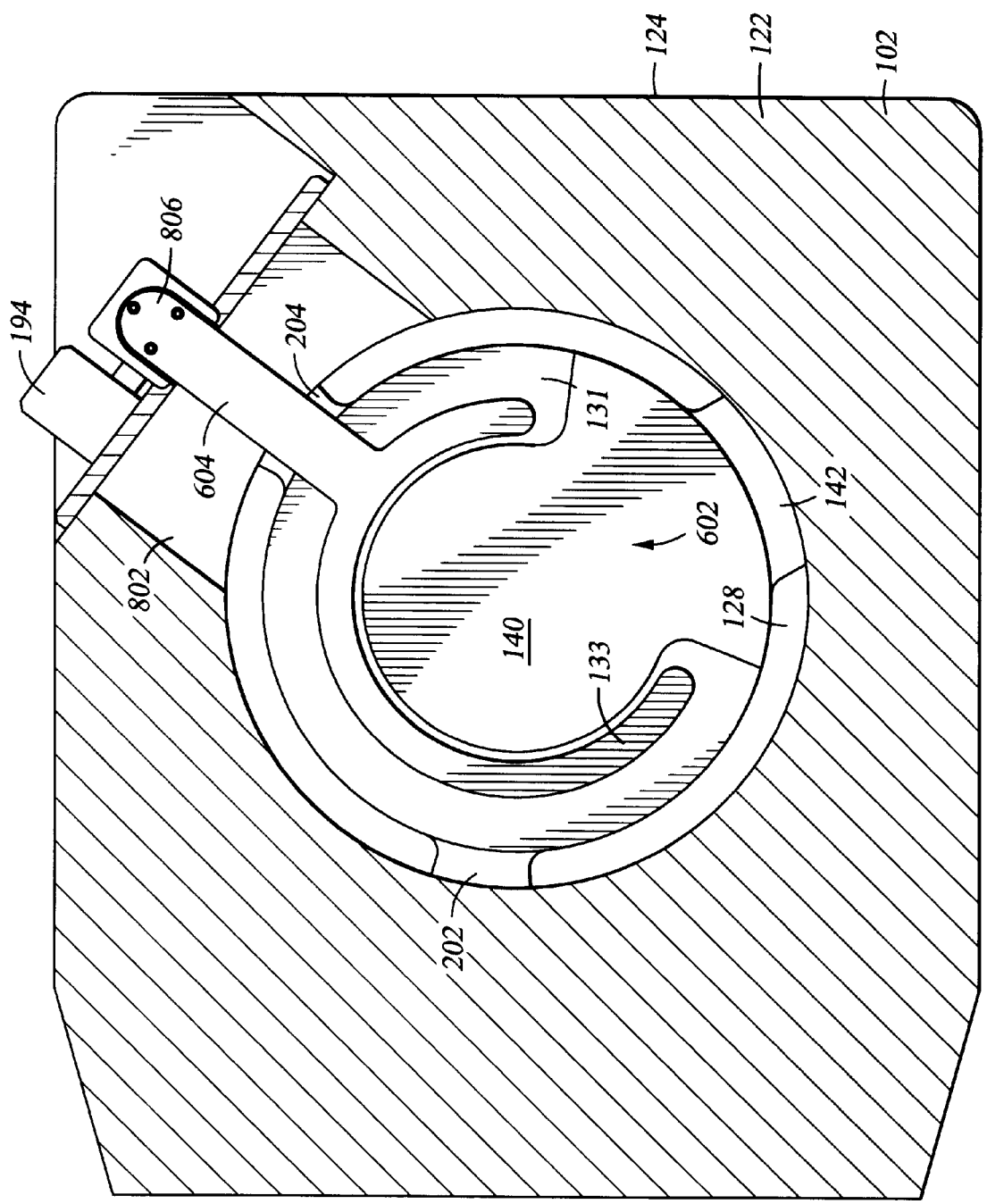
FIG. 8 depicts a bottom view of the processing system taken along section line 8—8 of FIG. 1.

FIG. 8 depicts a bottom view of the processing system taken along section line 8—8 of FIG. 1. FIG. 8 should be viewed along with FIGS. 1 and 6. In particular, FIG. 8 depicts the processing system 100 viewed as looking up into the exhaust passage 130 from the perspective of the throttle valve assembly 154 in FIG. 1. The lift-arm assembly 431 is aligned with the C-shaped slot 131 such that the actuation arm 604 of the lift-pin ring 133 extends from the actuator assembly 190 through a lift-arm port 802 and into the exhaust passage 130. Specifically, the lift-arm port 802 is positioned such that the actuation arm 604 and distal end 137 does not extend through the first support arm 142, and preferably not through any of the other support arms 202 and 204. Furthermore, the C-shaped slot 131 extends below the plane of the bottom 304 and radially from the one or more walls 302 of the centrally disposed recess 206. As such, the cross-section of the first support arm 142 is maximized, advantageously creating more space for the fluid supply lines, gas conduits, sensor leads, RF cables and other support assembly items when routed through a single support arm.

Moreover, the "C" shape of the lift-pin ring 133 allows for a smaller port 802 to be utilized as the lift-pin ring 133 can be "snaked" through the port 802. The connecting portion 606 is coupled through a bellows 192 to an actuator 194 of the actuator assembly 190 so that the processing region 128 remains sealed from the outside 124 of the sidewall 122 upon which the actuator assembly 190 is mounted. The actuator 194 provides the motion required for extending the lift-pins 404.

Referring primarily to FIG. 1, in operation, the substrate 101 is passed into the processing region 128 through the entry port 132 typically on a blade of a robot (not shown) disposed in the processing platform 120. The lift-arm assembly 431 is actuated to lift the substrate 101 from the robot blade, which then returns to the processing platform. As the lift-arm assembly 431 is retracted, the weight of the lift-pin assembly 402 causes the substrate 101 to be placed upon the support surface 712 of the electrostatic chuck 150. The electrostatic chuck 150 is then energized to retain the substrate 101 by supplying RF power through an RF cable (not shown).

The processing region 128 is brought to an operating pressure by exhausting the chamber 100 through the pumping stack 158 while process and other gases are delivered into the processing region 128 according to a process recipe from the modular gas module 108. RF power is supplied to the coils 182, igniting and sustaining a plasma within the processing region 128. The process gases react within the processing region 128 and deposit upon the substrates 101 and other surfaces of the chamber.

After deposition is complete, the electrostatic chuck 150 is deactivated and the lift-arm assembly 431 is actuated to lift the substrate 101 from the support surface 712. The robot then enters the chamber body 102 through the entry port 132 and retrieves the substrate.

Although the teachings of the present invention that have been shown and described in detail herein, those skilled in the art can readily devise other varied embodiments that still incorporate the teachings and do not depart from the spirit of the invention.

What is claimed is:

1. A modular lift-pin assembly comprising:
   a lift-pin having a distal end;
   a connector, comprising:
      an actuator end having a first plurality of catch fingers disposed around said actuator end;
      a lift-pin end having a second plurality of catch fingers disposed around said lift-pin end, wherein each of said first and second pluralities of catch fingers includes a lip extending radially inwards; and
      said lift-pin end coupled to the actuator end of said lift-pin; and
   an actuator pin coupled to the actuator end of said connector.

2. The lift-pin assembly of claim 1 wherein said distal end of said lift-pin is inserted into said second plurality of catch fingers of said lift-pin end of said connector.

3. The lift-pin assembly of claim 1 wherein said connector Is fabricated from a polymer.

4. The lift-pin assembly of claim 1 wherein said actuator pin comprises a projecting portion positioned proximate said actuator end of said connector wherein said lips of said first plurality of catch fingers of said connector snap fit over said projecting portion.

5. The lift-pin assembly of claim 1 wherein said actuator pin is fabricated from a ceramic material.

6. The lift-pin assembly of claim 4, wherein said lip comprises a flat that is substantially perpendicular to a central axis of said connector.

7. A lift-arm assembly comprising:
   a substantially C-shaped lift-pin ring;
   an actuation arm coupled to said C-shaped lift-pin ring; and
   a plurality of wear pads disposed on an upper surface of said C-shaped lift-pin ring.

8. The lift-arm assembly of claim 7 wherein the plurality of wear pads is three.

9. A semiconductor wafer processing chamber, comprising:
   a substrate support platform having a centrally disposed recess;
   a base disposed above said centrally disposed recess;
   a substrate support disposed over said base;
   a plurality of lift-pin holes extending through said support platform, said base, said substrate support, and circumscribing said centrally disposed recess;
   a plurality of modular lift-pin assemblies slidably extending through said lift-pin holes; and
   a C-shaped lift-arm assembly disposed below said base and engaging said plurality of lift-pin assemblies.

10. The processing chamber of claim 9, wherein each modular lift-pin assembly of said plurality of lift-pin assemblies comprises:
    a lift-pin having a distal end;
    a connector having a lift-pin end and an actuator end; the lift-pin end coupled to said distal end of said lift-pin; and
    an actuator pin coupled to the actuator end of said connector.

11. The processing chamber of claim 10 wherein each of said lift-pins is slidably disposed through a corresponding first bushing in said substrate support.

12. The processing chamber of claim 11 wherein said actuator pin is slidably disposed through a second bushing in said support platform and said actuator pin extends below said support platform.

13. The processing chamber of claim 12 wherein said actuator pin is guided by said second bushing.

14. The processing chamber of claim 10 wherein said connector comprises:
    a first plurality of catch fingers disposed around said actuator end; and
    a plurality of catch fingers disposed around said lift-pin end.

15. The processing chamber of claim 14 wherein said distal end of said lift-pin is inserted into said second plurality of catch fingers of said lift-pin end of said connector.

16. The processing chamber of claim 15 wherein said first and second pluralities of catch fingers includes a lip extending radically inwards, said lip having a flat that is substantially perpendicular to a central axis of said connector.

17. The processing chamber of claim 16 wherein said actuator pin comprises a projecting portion positioned proximate said actuator end of said connector wherein said lips of said first plurality of catch fingers of said connector snap fit over said projecting portion.

18. The processing chamber of claim 17 wherein said projecting portion having a diameter greater than a diameter defined by said lips of said first plurality of catch fingers and said projecting portion having an undercut, of said projecting portion to secure said actuator pin to said actuator end of said connector.

19. The processing chamber of claim 17 wherein said distal end having a diameter greater than a diameter defined by said lips of said second plurality of catch fingers and said distal end having an undercut, and the flat of said lips bank against said lift-pin end of said connector.

20. The processing chamber of claim 19 wherein said greater diameter portion of said actuator pin is positioned to lift a lift-pin side of said second bushing, and said greater diameter portion is larger than an inside diameter of said second bushing wherein travel of said lift-pin away from said support surface is limited.

21. The processing chamber of claim 9 wherein said C-shaped lift-arm assembly comprises:
    a substantially C-shaped lift-pin ring;
    an actuation arm coupled to said C-shaped lift-pin ring and a connecting portion disposed at a distal end of said actuation arm; and
    a plurality of wear pads disposed on an upper surface of said substantially C-shaped lift-pin ring.

22. The processing chamber of claim 21 wherein the plurality of wear pads is three.

23. The processing chamber of claim 21 wherein said lift-arm assembly actuates said plurality of lift-pins.

24. The processing chamber of claim 23 wherein said actuator pins of said lift-pin assemblies are disposed on the wear pads.

25. The processing chamber of claim 24 wherein said wear pads are larger in diameter of said actuator pins such that misalignment between said actuator pins and said C-shaped lift-pin ring is compensated for.

26. The processing chamber of claim 25 wherein said support platform further comprises a C-shaped slot in a second surface of said support platform and having a distance extending radically from said centrally disposed recess; and said connecting portion is coupled to an actuator for providing movement for extending said lift-pins.

27. The processing chamber of claim 26 wherein said C-shaped lift-pin ring travels into said slot of said second surface of said support platform in a raised position, wherein said lift-pins are raised via said actuator pins.

* * * * *